United States Patent
Pan et al.

(10) Patent No.: US 12,424,822 B2
(45) Date of Patent: Sep. 23, 2025

(54) SEMICONDUCTOR LASER DIODE INCLUDING MULTIPLE ACTIVE LAYERS AND A GRATING LAYER

(71) Applicant: VISUAL PHOTONICS EPITAXY CO., LTD., Taoyuan (TW)

(72) Inventors: Chien-Hung Pan, Taoyuan (TW); Yu-Chung Chin, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 574 days.

(21) Appl. No.: 17/955,291

(22) Filed: Sep. 28, 2022

(65) Prior Publication Data

US 2023/0102405 A1    Mar. 30, 2023

(30) Foreign Application Priority Data

Sep. 29, 2021 (TW) .................................. 110136201

(51) Int. Cl.
| | |
|---|---|
| *H01S 5/00* | (2006.01) |
| *H01S 5/11* | (2021.01) |
| *H01S 5/125* | (2006.01) |
| *H01S 5/183* | (2006.01) |
| *H01S 5/185* | (2021.01) |
| *H01S 5/22* | (2006.01) |
| *H01S 5/30* | (2006.01) |
| *H01S 5/34* | (2006.01) |
| *H01S 5/40* | (2006.01) |
| *H01S 5/32* | (2006.01) |
| *H01S 5/343* | (2006.01) |

(52) U.S. Cl.
CPC ................ *H01S 5/11* (2021.01); *H01S 5/125* (2013.01); *H01S 5/18305* (2013.01); *H01S 5/18361* (2013.01); *H01S 5/185* (2021.01); *H01S 5/22* (2013.01); *H01S 5/3095* (2013.01); *H01S 5/3416* (2013.01); *H01S 5/4043* (2013.01); *H01S 5/3213* (2013.01); *H01S 5/34313* (2013.01)

(58) Field of Classification Search
CPC ........ H01S 5/11; H01S 5/125; H01S 5/18305; H01S 5/18361; H01S 5/185; H01S 5/22; H01S 5/3095; H01S 5/3416; H01S 5/4043; H01S 5/3213; H01S 5/34313
See application file for complete search history.

(56) References Cited

U.S. PATENT DOCUMENTS

| | | | | |
|---|---|---|---|---|
| 2017/0256915 | A1* | 9/2017 | Ghosh | H01S 5/1833 |
| 2021/0003385 | A1* | 1/2021 | Tan | H01S 5/0262 |
| 2021/0391691 | A1* | 12/2021 | Sugiyama | H01S 5/3211 |
| 2025/0055257 | A1* | 2/2025 | Dai | H01S 5/18311 |

* cited by examiner

*Primary Examiner* — Kinam Park
(74) *Attorney, Agent, or Firm* — Wegman Hessler Valore (57) ABSTRACT

Provided is a semiconductor laser diode including multiple active layers and a grating layer. The semiconductor laser diode includes two (or more than two) active layers, a grating layer, and a tunnel junction. The grating layer and the tunnel junction are provided between the two active layers. The tunnel junction is electrically connected to the two active layers, and the two active layers share and are optically coupled to the grating layer, thereby improving the external quantum efficiency and slope efficiency of the semiconductor laser diode.

11 Claims, 12 Drawing Sheets

SEMICONDUCTOR LASER DIODE INCLUDING MULTIPLE ACTIVE LAYERS AND A GRATING LAYER

CROSS-REFERENCE TO RELATED APPLICATION

This application claims priority to Taiwanese Application Serial No. 110136201, filed on Sep. 29, 2021. The entirety of the above-mentioned patent application is hereby incorporated by reference herein and made a part of this specification.

TECHNICAL FIELD

The technical field relates to a semiconductor laser diode, especially a semiconductor laser diode including multiple active layers and a grating layer, wherein the grating layer is provided between two active layers, and the two active layers share the grating layer and are optically coupled to the grating layer, thereby improving the external quantum efficiency and the slope efficiency of the semiconductor laser diode.

BACKGROUND

A semiconductor laser or a laser diode has the advantages of small size, low power consumption, fast response, impact resistance, long lifetime, high efficiency and low price. Accordingly, it is widely used in optoelectronic systems, such as light wave communications, information systems, household appliances, precision measurements and optical fiber communications, etc. In addition, since the distributed feedback laser (DFB) has the characteristics of simple process, single-mode output and long-distance transmission, the laser light signal generated by the DFB can still maintain a good signal-to-noise ratio after long-distance transmission. Therefore, it has become a widely used light source in today's light wave communication and optical fiber communication systems.

However, in the application for detecting ranges such as LiDAR (Light Detection And Ranging), objection detection (such as 3D sensing) and others, the optical output power of the semiconductor laser with a single active layer and a grating layer is insufficient. As such, the application of LiDAR requires a semiconductor laser with high optical output power.

SUMMARY

The embodiment of the present disclosure is a semiconductor laser diode with high optical output power, and its external quantum efficiency and slope efficiency are better than the existing semiconductor laser diodes. Compared with the conventional ones, the epitaxial structure of the semiconductor laser diode in the embodiment of the present disclosures has more active layers (or active regions), and in some embodiments, a horizontal cavity instead of a vertical cavity is used for generating laser light, but laser light is emitted perpendicular to the semiconductor wafer surface.

Generally speaking, as the number of active layers (or active regions) increases, the number of grating layers may increase correspondingly or the grating structure may need to be changed correspondingly, but this will inevitably increase both the time and the difficulty of fabrication.

In the embodiment, the grating layer is provided between two active layers such that the two active layers can share the grating layer. Hence, there is no need to increase the number of grating layers, and even the structure design of the grating layers may need no changes. Therefore, not only the number of the grating layers can be reduced, but also the fabrication procedure of the epitaxial structure of the semiconductor laser diode can be simplified.

Also, when the laser optical field distribution of the two active layers can be optically coupled to the grating layer, the slope efficiency and the external quantum efficiency of the semiconductor laser diode can be significantly improved. In light of the foregoing, the optical output power of the semiconductor laser diode fabricated with the epitaxial structure based on embodiments herein is significantly improved. Also, due to the easy fabrication process of the epitaxial structure of the present disclosure, the fabrication cost is not significantly increased.

In one embodiment, a semiconductor laser diode includes two active layers, a grating layer and a tunnel junction. The grating layer and the tunnel junction are disposed between the two active layers. The tunnel junction disposed between the two active layers electrically connect the two active layers in series, and the two active layers share/use the grating layer and are optically coupled to the grating layer.

In one embodiment, provided is a semiconductor laser diode, including a substrate; a first epitaxial stack structure that is disposed on the substrate and includes a first active layer, wherein the first active layer includes one or a plurality of first quantum well layers, and generates a first optical field distribution; a grating layer disposed above the first epitaxial stack structure; a second epitaxial stack structure that is disposed above the grating layer and includes a second active layer, wherein the second active layer includes one or a plurality of first quantum well layers, and generates a second optical field distribution; a tunnel junction inserted between the first active layer and the second active layer to electrically connect the first active layer and the second active layer, wherein the grating layer is disposed between the first active layer and the second active layer, and the first optical field distribution and the second optical field distribution are both optically coupled to the grating layer. Especially in range finding application like LIDAR system. How more light extractions through grating pattern design has been studied in many ways. The ideal firstly disclosed here using multiple junctions (active region) optically coupled to one grating layer and electrically linked through a tunnel junction, thereby improving the external quantum efficiency and slope efficiency of the semiconductor laser diode.

DESCRIPTION OF THE EMBODIMENTS

The embodiment of the present disclosure is described in detail below with reference to the drawings and element symbols, such that persons skilled in the art are able to implement the present application after understanding the specification of the present disclosure.

Specific examples of components and arrangements are described below to simplify the present disclosure. These are, of course, merely examples and not intended to limit the scope of the present disclosure. In the present disclosure, for example, when a layer formed above or on another layer, it may include an exemplary embodiment in which the layer is in direct contact with the another layer, or it may include an exemplary embodiment in which other devices or epitaxial layers are formed between thereof, such that the layer is not in direct contact with the another layer. In addition, repeated reference numerals and/or notations may be used in different embodiments, and they are repeated only for simple and clear description of some embodiments, not representing a specific relationship between different embodiments and/or structures discussed.

Further, spatially relative terms, such as "underlying," "below," "lower," "overlying," "above," "upper" and the like, may be used herein for ease of description of one device or feature's relationship to another device(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including," "having," "with," "wherein," or the foregoing transformations used herein, they are similar to the term "comprising" to include corresponding features.

In addition, a "layer" may be a single layer or a plurality of layers; and "a portion" of an epitaxial layer may be one layer of the epitaxial layer or a plurality of adjacent layers.

Figure 1:
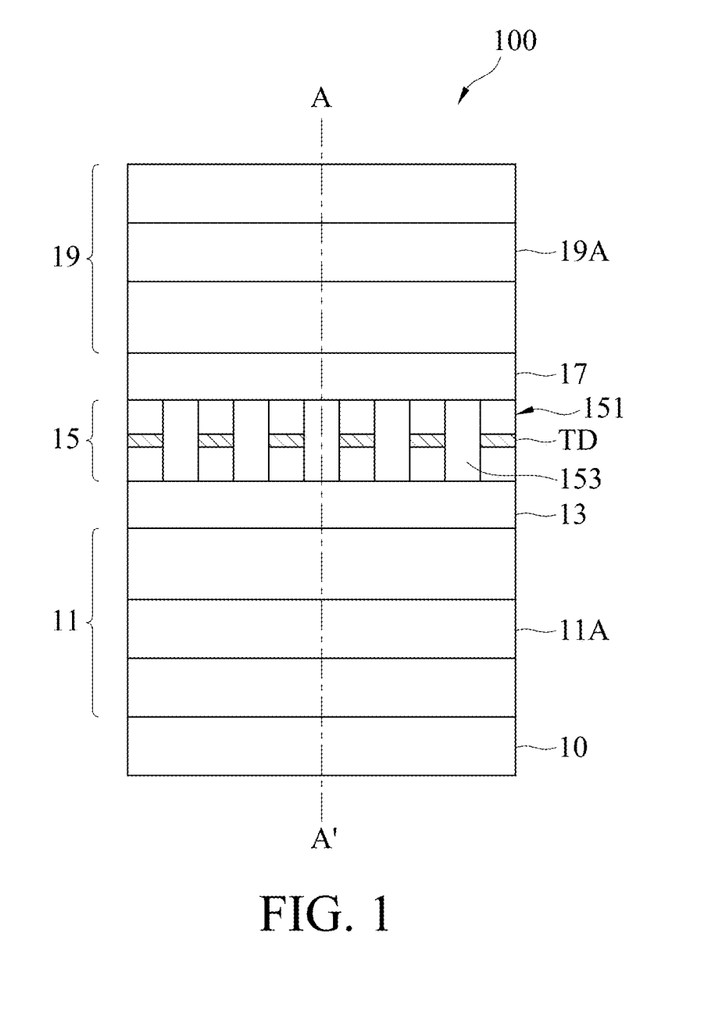
FIG. 1 is a schematic diagram showing a semiconductor laser diode according to an embodiment of the present disclosure.

FIG. 1 is a schematic diagram of a semiconductor laser diode according to an embodiment of the present disclosure. As shown in FIG. 1, the semiconductor laser 100 includes a substrate 10, a first epitaxial stack structure 11, a first interlayer 13, a grating layer 15, a second interlayer 17, and a second epitaxial stack structure 19. The first epitaxial stack structure 11 and the second epitaxial stack structure 19 include a first active layer 11A and a second active layer 19A, respectively. The first active layer 11A generates a first optical field distribution, and the second active layer 19A generates a second optical field distribution.

The grating layer 15 is disposed between the first active layer 11A and the second active layer 19A. The first active layer 11A and the second active layer 19A share the grating layer 15 and are "optically coupled" to/with the grating layer 15. Accordingly, the semiconductor laser diode can provide in-plane optical feedback. As a result, the slope efficiency of the semiconductor laser diode is improved. The semiconductor laser 100 further includes a tunnel junction TD disposed between the first active layer 11A and the second active layer 19A for electrically connecting the first active layer 11A and the second active layer 19A in series. The tunnel junction TD includes a highly doped P-type layer and a highly doped N-type layer.

The above-mentioned "optically coupled" means that a part of the first optical field distribution and a part of the second optical field distribution are distributed in the grating layer 15. Such design allows the grating layer 15 to provide strong in-plane optical feedback. For example, a part of the first optical field distribution is distributed to a part of the grating layer close to the first active layer such as the lower side of the grating layer, and a part of the second optical field distribution is distributed to a part of the grating layer close to the second active layer such as the upper side of the grating layer. The two active layers can emit laser light with the same or different wavelengths and/or the same or different polarizations such that different design requirements can be achieved The grating structure design of the grating layer 15 may be a first-order grating or a second-order grating according to actual requirements. With using second order grating (i.e. $L=1/N_{eff}$), light emission can be normal to the surface through grating diffraction, which offer another solution to surface emitting laser. Surface emitting laser has advantage of on wafer test, without laser bar cleavage and facet coating compared to the edge emitting laser, thus is more cost effective and fabrication efficient. With further using 2D grating, or say photonic crystal, one can produce laser with small far field angle with good beam quality, which can even be employed in lens free system.

In one embodiment, the grating layer 15 includes a plurality of high refractive index layers 151 and a plurality of low refractive index layers 153. Preferably (see FIG. 1), the tunnel junction TD can be a part of the high refractive index layer 151, such as the middle part of the high refractive index layer 151, and a semiconductor layer may be disposed above and/or below the tunnel junction TD (see FIG. 6). Preferably, the tunnel junction TD is disposed at or near the minimum optical intensity of the optical field distribution. Consequently, if the position where the minimum optical intensity of the (laser) optical field distribution changes, the position where the tunnel junction TD is arranged can also be changed accordingly. For example, the tunnel junction TD is sandwiched in the high refractive index layer 151 of the grating layer 15. Alternatively, the tunnel junction TD is disposed above or below the grating layer 15.

Figure 2:
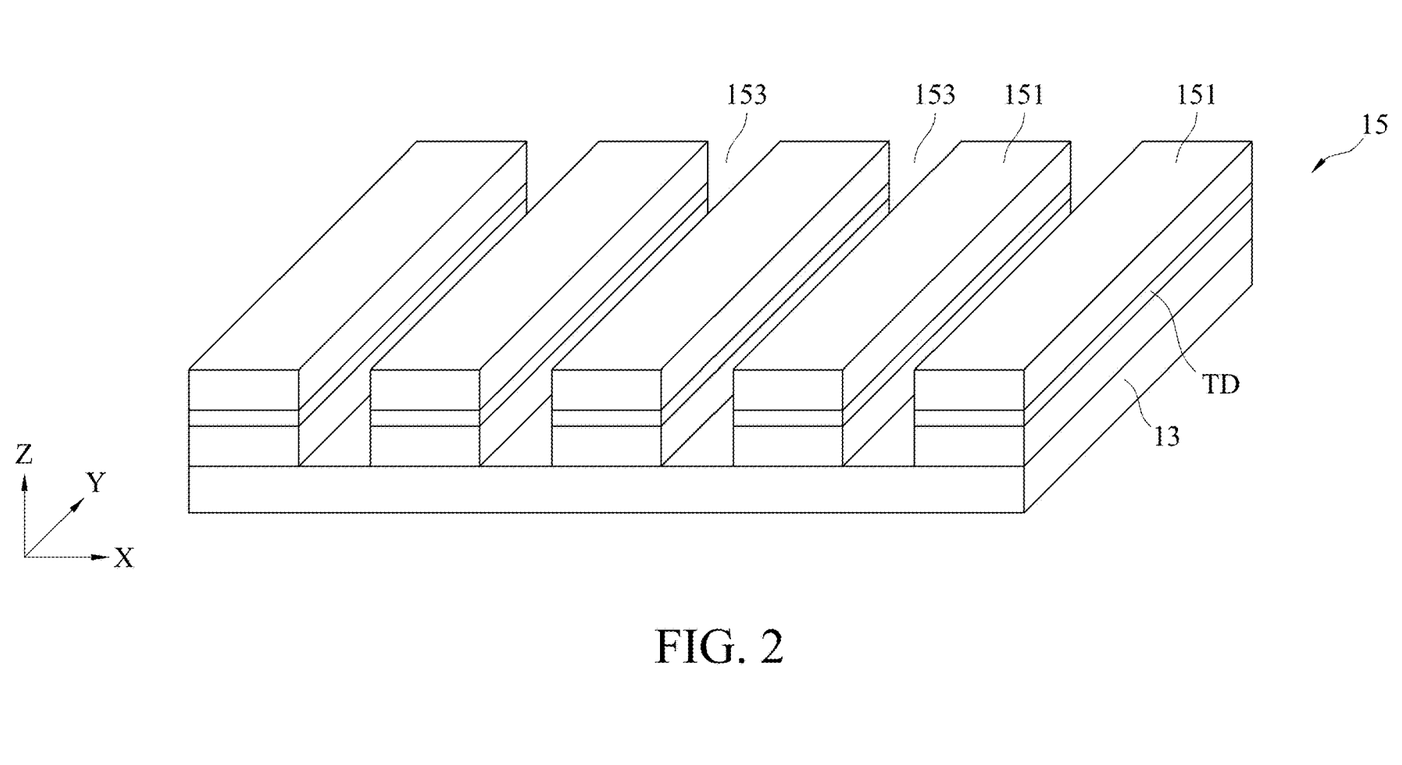
FIG. 2 is a schematic diagram showing a grating layer having a one-dimensional periodic structure according to an embodiment of the present disclosure.

The low refractive index layer 153 may be a void, a semiconductor material, a dielectric material, a photonic crystal, or the like. When the low refractive index layer 153 is a void, a semiconductor material or a dielectric material, the grating layer 15 is a one-dimensional periodic structure. That is, as shown in FIG. 2, the high refractive index layer 151 and the low refractive index layer 153 are periodically arranged one-dimensionally along a first horizontal direction X (not limited to the X direction as shown in FIG. 2, but may be along the Y direction in another embodiment). The first horizontal direction X is perpendicular to the thickness direction Z (i.e., Z direction) of the grating layer.

Figure 3:
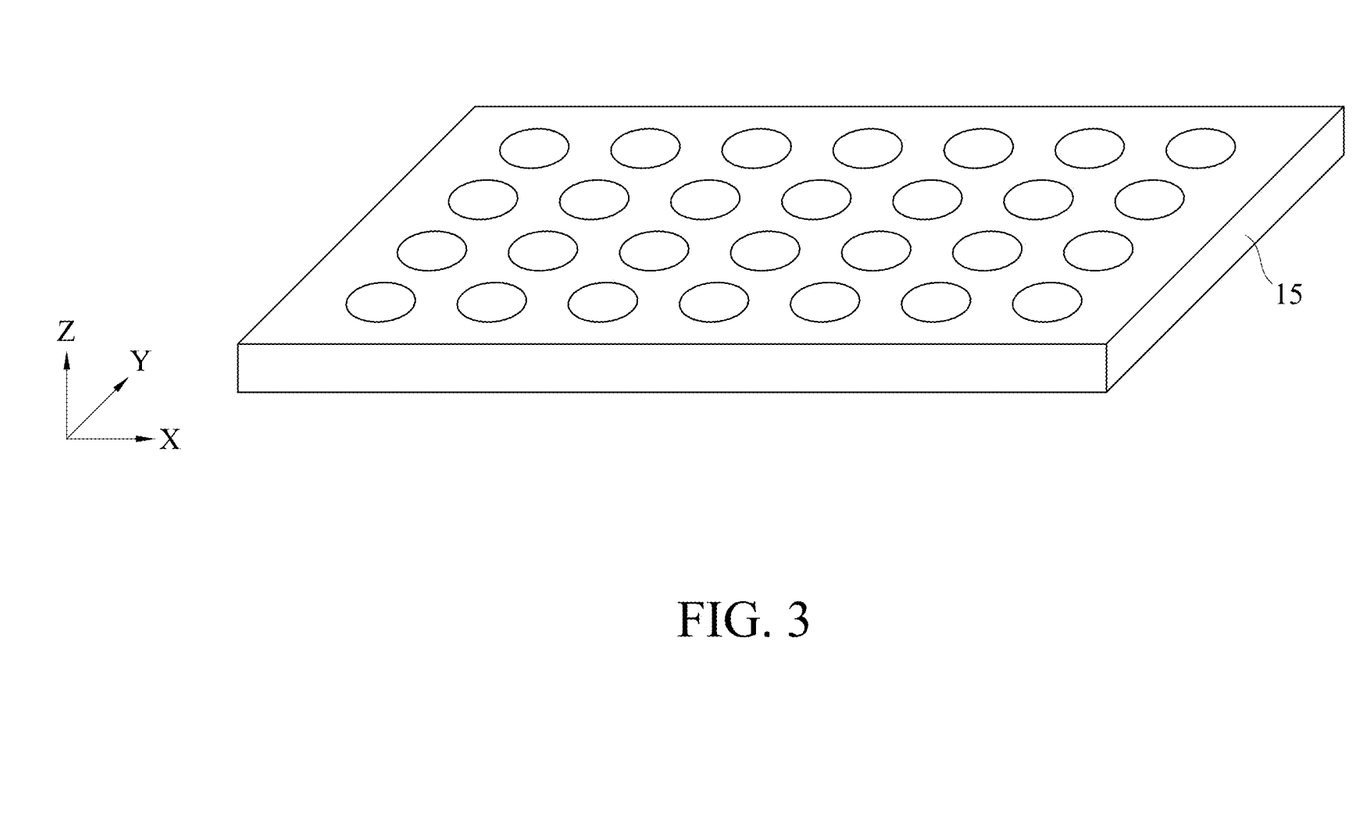
FIG. 3 is a schematic diagram showing a grating layer being a photonic crystal layer according to an embodiment of the present disclosure.

As shown in FIG. 3, the grating layer may be a photonic crystal layer, the photonic crystal layer includes a plurality of micro photonic crystal structures distributed and arranged along both a first horizontal direction and a second horizontal direction, and the second horizontal direction is perpendicular to the first horizontal direction In principle, the material of the substrate 10 may be InP or GaAs. The material for forming each epitaxial layer on the substrate 10 may be $In_xGa_yAl_{1-x-y}As$, wherein $0 \leq x \leq 1$ and $0 \leq y \leq 1$. Alternatively, the material for forming each epitaxial layer on the substrate 10 may be $In_xGa_{1-x}As_yP_{1-y}$, wherein $0 \leq x \leq 1$ and $0 \leq y \leq 1$. Preferably, the tunnel junction may be InGaAsSb.

Figure 4:
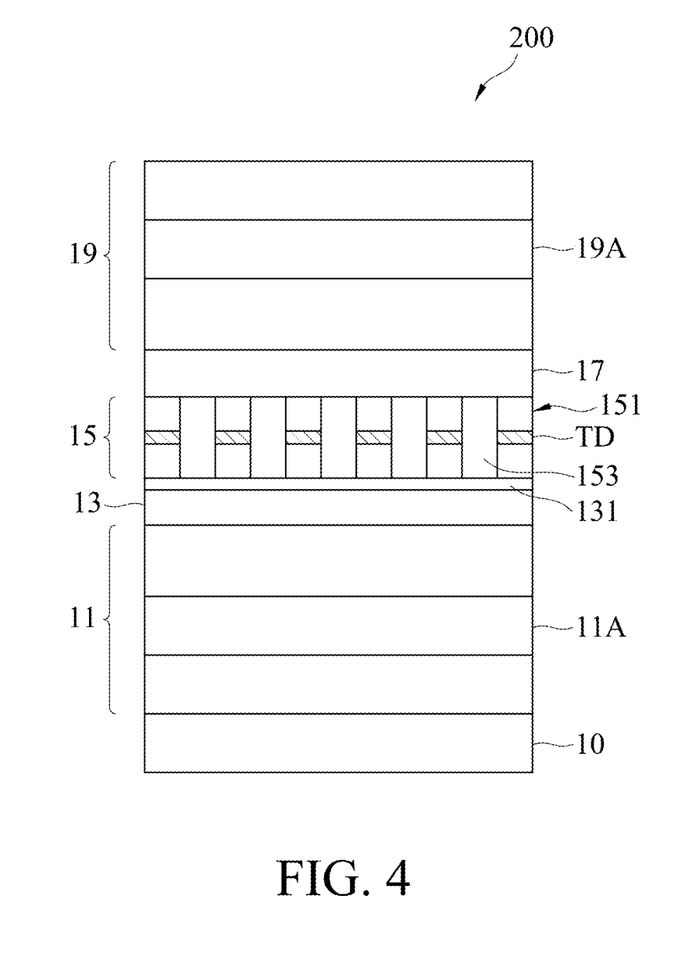
FIG. 4 is a schematic diagram showing an etching stop layer disposed between the first interlayer and the grating layer according to an embodiment of the present disclosure.

FIG. 4 is a schematic diagram of further disposing an etching stop layer between the first interlayer and the grating layer according to an embodiment of the present disclosure. As shown in the epitaxial structure 200 of FIG. 4, the etching stop layer 131 is formed on the first interlayer 13, and the grating layer 15 is formed on the etching stop layer 131 such that the grating layer 15 can be easily fabricated. Alternatively, the etching stop layer 131 may be formed in a portion of the first interlayer 13 close to the grating layer 15.

Figure 5:
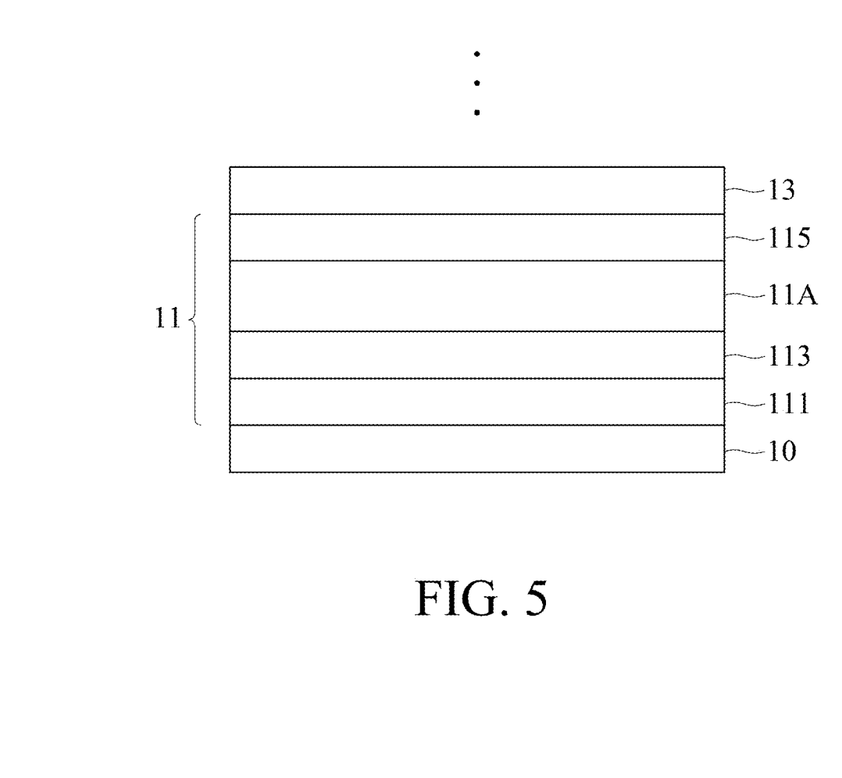
FIG. 5 is schematic diagram showing a first epitaxial stack structure according to an embodiment of the present disclosure.

FIG. 5 is a schematic diagram showing the first epitaxial stack structure according to an embodiment of the present disclosure. As shown in FIG. 5, the first epitaxial stack structure 11 is formed on the substrate 10, wherein a first cladding layer 111, a first separate confinement heterostructure (SCH) layer 113, a first active layer (having a quantum well or multiple quantum wells) 11A and a second SCH layer 115 are sequentially formed from bottom to top. The substrate 10 may be an InP substrate. The material of the first cladding layer 111 may be InP. The material of the first SCH layer 113 may be InAlAs. The material of the first active layer 11A may be InAlGaAs. The material of the second SCH layer 115 may be InAlAs. The material of the first interlayer 13 on the first epitaxial stack structure 11 may be InP. If the etching stop layer 131 is provided on the first interlayer 13 or inserted in the first interlayer 13 (see FIGS. 4 and 6), the material of the etching stop layer 131 may be InGaAsP.

Figure 6:
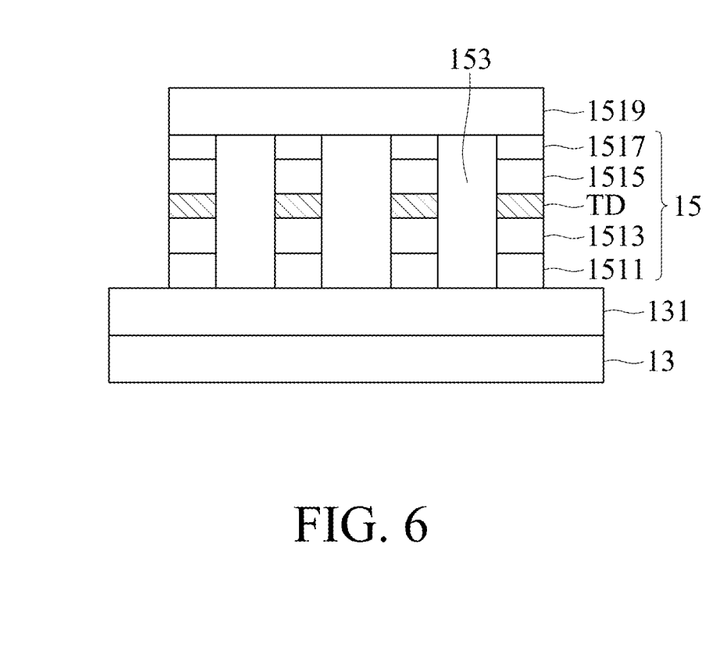
FIG. 6 is a schematic diagram showing a grating layer according to an embodiment of the present disclosure.

FIG. 6 is a schematic diagram of the grating layer according to an embodiment of the present disclosure. As shown in FIG. 6, the high refractive index layer 151 of the grating layer 15 includes a second cladding layer 1511, a first resistance reduction layer 1513, a tunnel junction TD, a third cladding layer 1515, an optical extending layer 1517, and a cover layer 1519 from bottom to top. In addition, the optical extending layer 1517 is used to expand or compress the optical field distribution (shape), and the second epitaxial stack structure (not shown) is formed on the cladding layer.

The material of the second cladding layer 1511 may be InP. The material of the first resistance reduction layer 1513 may be InGaAsP. The material of the tunnel junction TD may be InGaAs or InGaAsP. The P-type layer of the tunnel junction may be doped with carbon (C). The N-type layer of the tunnel junction may be doped with tellurium (Te). The material of the third cladding layer 1515 may be InP. The material of the optical extending layer 1517 may be InGaAsP. The material of the cover layer 1519 may be InP. In principle, the epitaxial layer or semiconductor layer in direct contact or adjacent to the grating layer may expand or compress the optical field distribution (shape). For example, the cladding layer 1519 may adjust the optical field distribution. Alternatively, the cladding layer 1519 may be replaced by a whole optical extending layer formed on the optical extending layer 1519.

Figure 7:
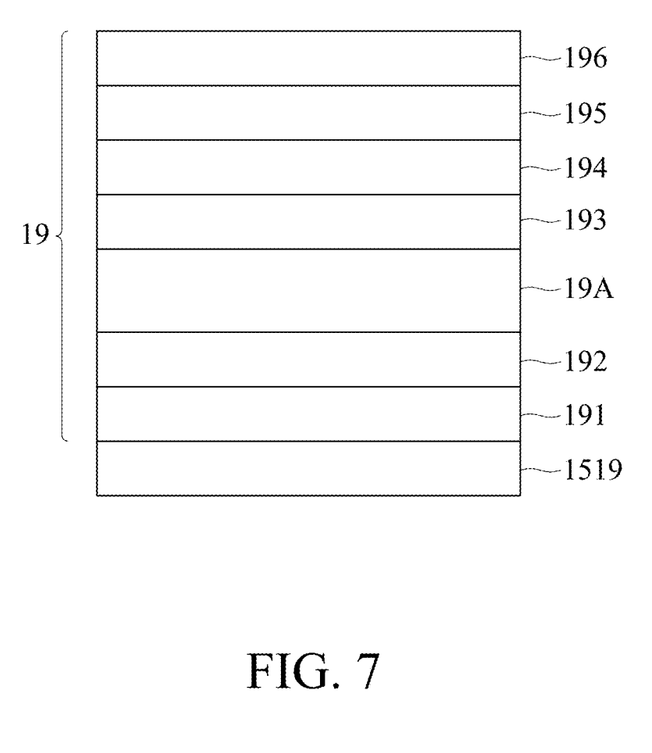
FIG. 7 is a schematic diagram showing a second epitaxial stack structure according to an embodiment of the present disclosure.

FIG. 7 is a schematic diagram of the second epitaxial stack structure according to an embodiment of the present disclosure. As shown in FIG. 7, the second epitaxial stack structure 19 includes a fourth cladding layer 191, a third SCH layer 192, a second active layer (having a quantum well or multiple quantum wells) 19A, a fourth SCH layer 193, a fifth cladding layer 194, a second resistance reduction layer 195, and an ohmic contact layer 196. The material of the fourth cladding layer 191 may be InP. The material of the third SCH layer 192 may be InAlAs. The material of the second active layer 19A may be InAlGaAs. The material of the fourth SCH layer 193 may be InAlAs. The material of the fifth cladding layer 194 may be InP. The material of the second resistance reduction layer may be InGaAsP. The material of the ohmic contact layer 196 may be InGaAs.

Figure 8:
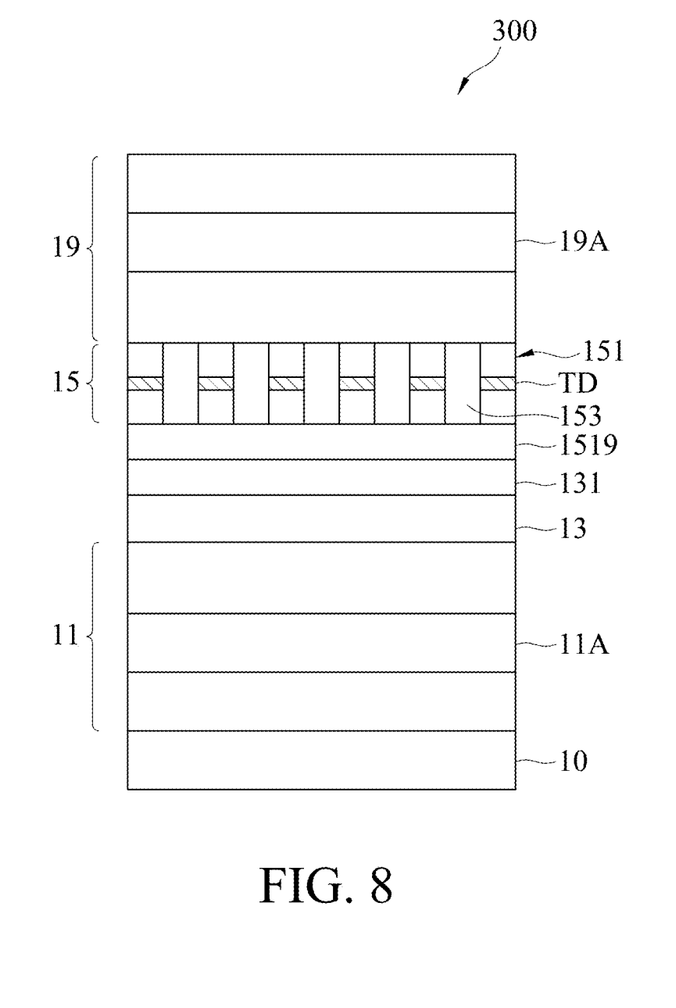
FIG. 8 is a schematic diagram showing that a low refractive index layer in the grating layer is a dielectric material according to an embodiment of the present application.

FIG. 8 is a schematic diagram illustrating that the low refractive index layer of the grating is a dielectric material according to an embodiment of the present disclosure. The low refractive index layer 153 in the grating layer 15 of FIG. 8 is a dielectric material or a semiconductor material. Although FIG. 8 is substantially the same as FIG. 1, since the grating layer contains a dielectric material, the manufacturing methods thereof are different, thereby the structures thereof being slightly different. As shown in the epitaxial structure of FIG. 8, an etching stop layer 131 is epitaxially grown on the first interlayer 13, and a cladding layer 1519 is further formed on the etching stop layer 131. Besides, in the epitaxial structure of FIG. 8, the second epitaxial stack structure 19 is directly formed on the grating layer 15 such that a second interlayer is not required between the grating layer 15 and the second epitaxial stack structure 19, but not limited thereto, and it can still vary according to actual needs.

In one embodiment, the first cladding layer 111 and the first SCH layer 113 have the same conductivity type as the substrate 10, such as N-type. The second SCH layer 115, the first interlayer 13, the first etching stop layer 131, the second cladding layer 1511 and the first resistance reduction layer 1513 have the conductivity type opposite to that of the substrate 10, such as P-type. The third cladding layer 1515, the optical extending layer 1517, the cover layer 1519, the fourth cladding layer 191, the third SCH layer 192 have the same conductivity type as the substrate 10, such as N-type. Additionally, the fourth SCH layer 193, the fifth cladding layer 194, the second resistance reduction layer 195 and the ohmic contact layer 196 have a conductivity type opposite to that of the substrate 10, such as P-type.

The first active layer 11A and the second active layer 19A can be multiple quantum well (MQW) structures composed of InAlGaAs, and the period number of the quantum well can be 7, but not limited thereto.

Figure 9A:
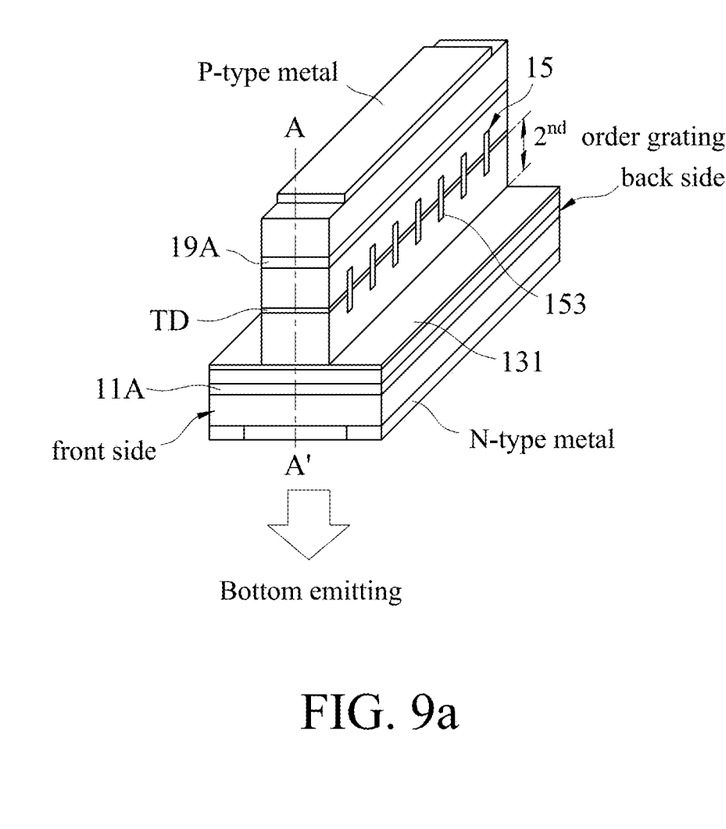
FIG. 9a is a schematic diagram showing a semiconductor laser diode with a ridge structure according to an embodiment of the present disclosure.
Figure 9B:
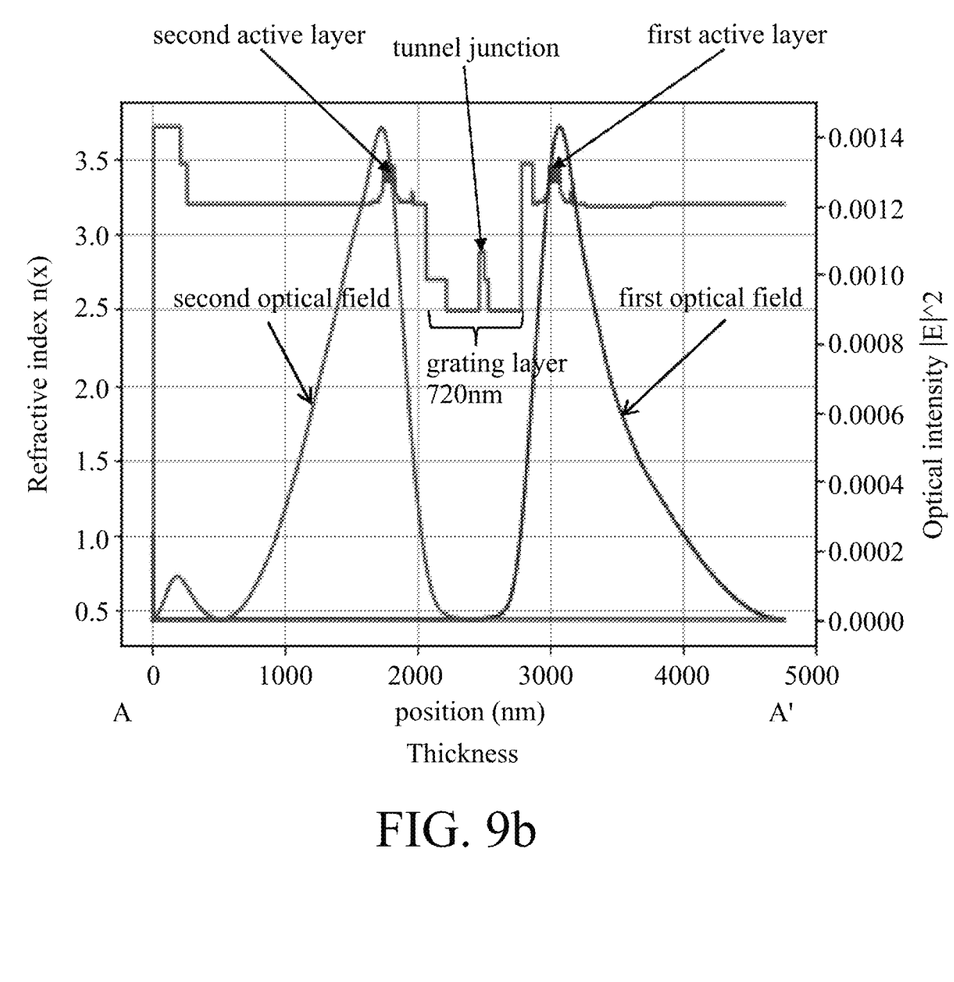
FIG. 9b is an optical field distribution diagram of the first active layer and the second active layer in FIG. 9a according to an embodiment of the present disclosure.

In an embodiment of FIG. 9a, FIG. 9a shows a semiconductor laser diode with a ridge structure, and the grating layer is a second-order grating. The first optical field distributions of the first active layer and the second optical field distributions of the second active layer in FIG. 9a are shown in FIG. 9b. Both the first active layer and the second active layer are optically coupled to the second-order grating (the thickness thereof is about 720 nm). When both the first active layer and the second active layer are optically coupled to the second-order grating, the slope efficiency of the semiconductor laser diode will be significantly improved. Since the active layer is disposed above or below the grating layer and the two active layers are optically coupled to the grating layer, the slope efficiency and/or the external quantum efficiency of the semiconductor laser diode are improved.

In one embodiment, the semiconductor laser diode is a vertical-cavity surface emitting laser diode, a horizontal-cavity surface emitting laser diode and an edge emitting laser diode or a DFB laser.

Figure 10A:
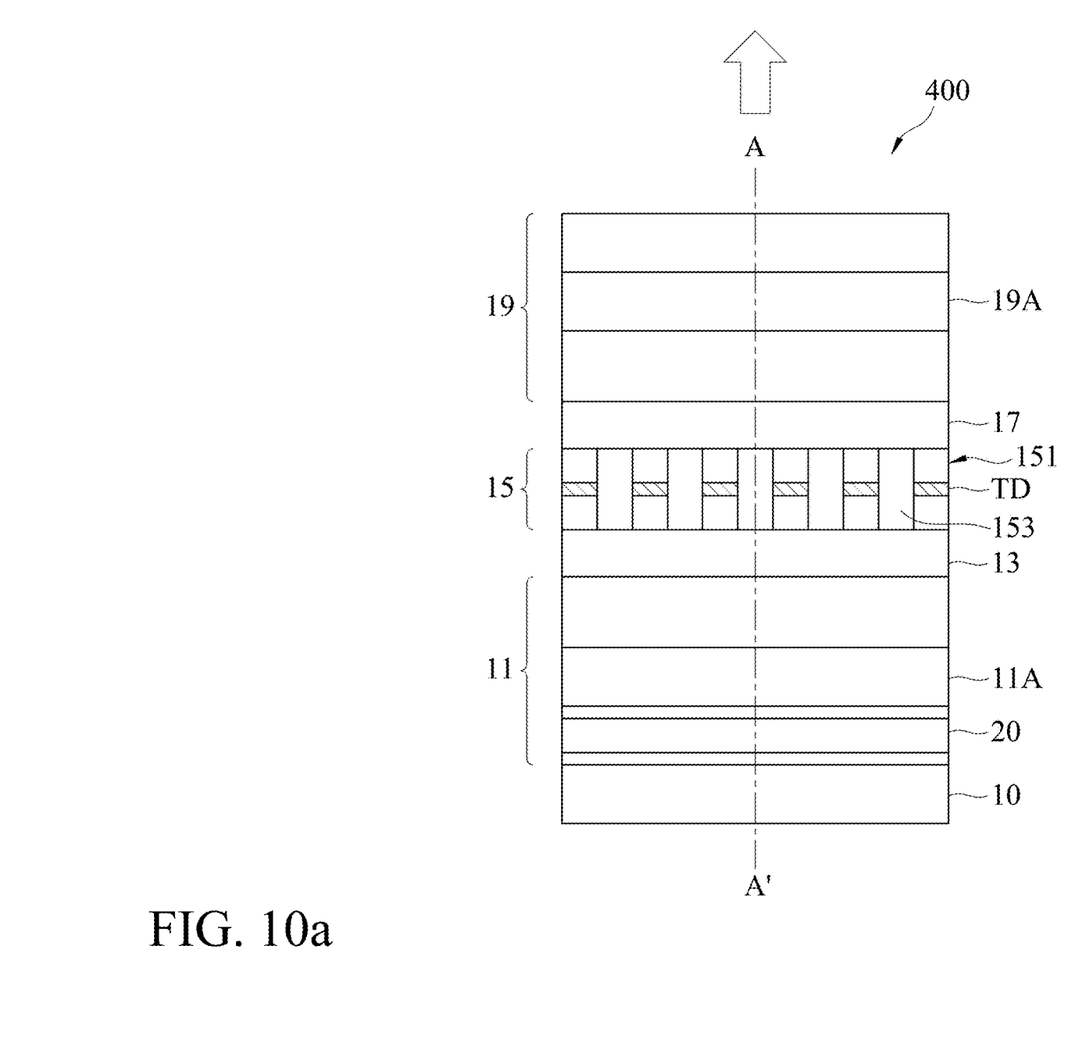
FIG. 10a is a schematic diagram showing the arrangement of the distributed Bragg reflector (DBR) layer on the bottom-emitting semiconductor laser diode according to an embodiment of the present disclosure.
Figure 10B:
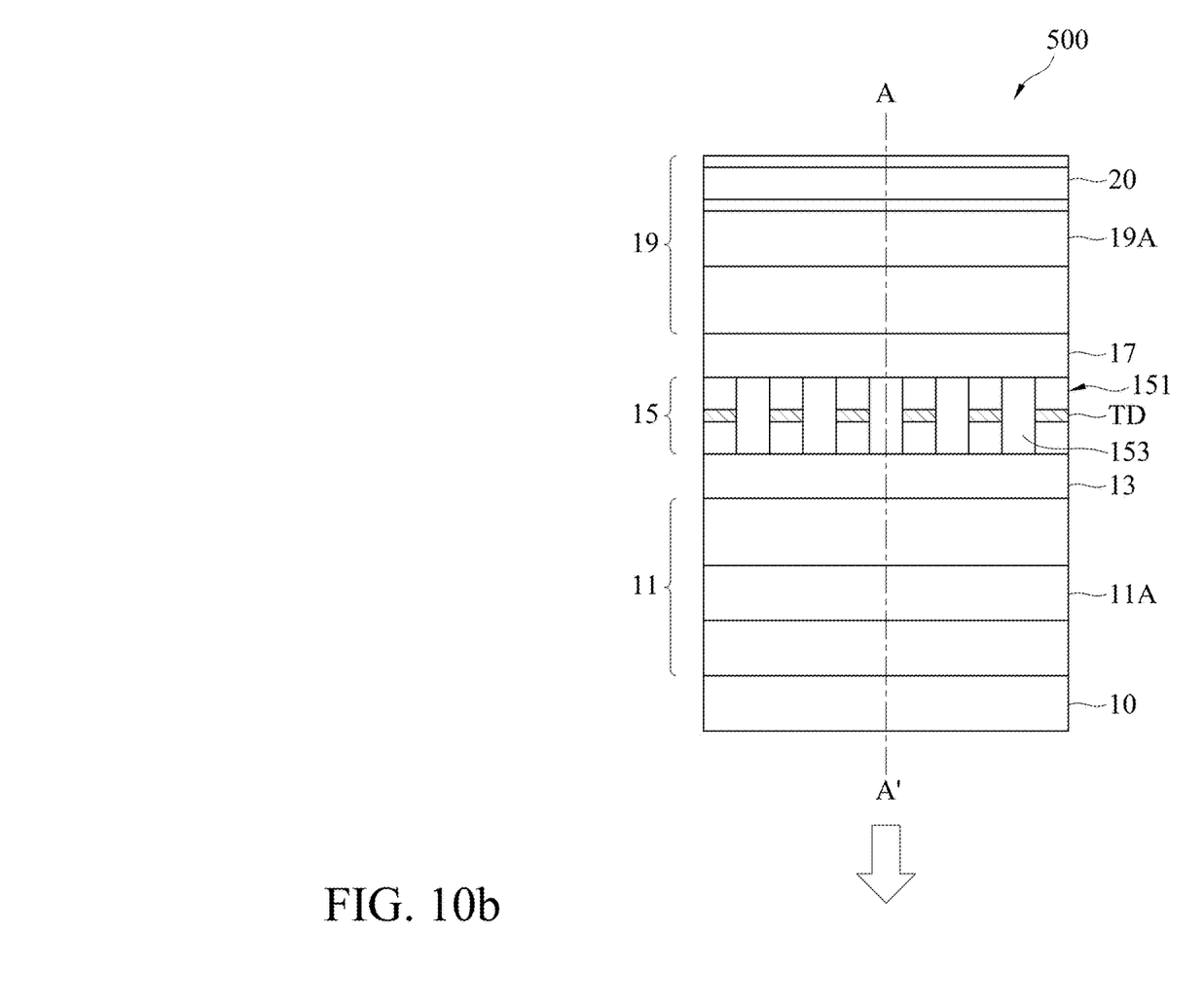
FIG. 10b is a schematic diagram showing the arrangement of the DBR layer on the top-emitting semiconductor laser diode according to an embodiment of the present disclosure.

FIG. 10a shows a top-emitting semiconductor laser diode 400. When the top-emitting type semiconductor laser diode 400 is further provided with a distributed Bragg reflector (DBR) layer 20, and the DBR layer 20 is disposed below the grating layer 15 of the second-order grating and the first active layer 11A, the optical output power of the top-emitting semiconductor laser diode can be improved. Additionally, FIG. 10b shows a bottom-emitting semiconductor laser diode 500, and the DBR layer 20 is disposed above the grating layer of the second-order grating and the second active layer 19A. Accordingly, the optical output power of the bottom-emitting semiconductor laser diode can be improved. Moreover, the top-emitting semiconductor laser diode means that light is emitted from the epitaxial surface of the epitaxial structure, and the bottom-emitting semiconductor laser diode means that light is emitted from the substrate or the side of the epitaxial structure facing the substrate.

When the grating layer is a one-dimensional periodic arrangement, and the semiconductor laser is a semiconductor laser diode with a ridge-like structure, the front and back sides of the semiconductor laser (with horizontal resonance between the front and back sides) are respectively arranged with a DBR layer, thereby improving the output power of the semiconductor laser diode and reducing the threshold current.

Further, the epitaxial layers in the first epitaxial stack structure and the second epitaxial stack structure are fabricated by metal organic chemical vapor deposition (MOCVD), Molecular Beam Epitaxy (MBE) or other epitaxial growth methods.

It will be apparent to those skilled in the art that various modifications and variations can be made to the disclosed embodiments. It is intended that the specification and examples are provided for exemplary purposes only, with a true scope of the disclosure being indicated by the following claims and their equivalents.

What is claimed is:

1. A semiconductor laser diode, comprising:
   a substrate;
   a first epitaxial stack structure disposed on the substrate and including a first active layer, wherein the first active layer includes one or a plurality of first quantum well layers, and generates a first optical field distribution;
   a grating layer disposed above the first epitaxial stack structure;
   a second epitaxial stack structure disposed above the grating layer and including a second active layer, wherein the second active layer includes one or a plurality of second quantum well layers, and generates a second optical field distribution; and
   a tunnel junction disposed between the first active layer and the second active layer to electrically connect the first active layer and the second active layer in series,
   wherein the grating layer is disposed between the first active layer and the second active layer, and the first optical field distribution and the second optical field distribution are both optically coupled to the grating layer.

2. The semiconductor laser diode according to claim 1, wherein the tunnel junction is disposed above or below the grating layer.

3. The semiconductor laser diode according to claim 1, wherein the grating layer includes a plurality of high refractive index layers and a plurality of low refractive index layers, and the tunnel junction is sandwiched in the plurality of high refractive index layers.

4. The semiconductor laser diode according to claim 1, wherein the grating layer includes a plurality of high refractive index layers and a plurality of low refractive index layers, and the low refractive index layers are void, dielectric materials or semiconductor materials.

5. The semiconductor laser diode according to claim 3, wherein the grating layer is a one-dimensional periodic structure or a two-dimensional periodic structure.

6. The semiconductor laser diode according to claim 1, wherein the grating layer is a photonic crystal layer, the photonic crystal layer includes a plurality of micro photonic crystal structures distributed and arranged along both a first horizontal direction and a second horizontal direction, and the second horizontal direction is perpendicular to the first horizontal direction.

7. The semiconductor laser diode according to claim 1, wherein the grating layer is a first-order grating or a second-order grating.

8. The semiconductor laser diode according to claim 1, wherein the semiconductor laser diode is a surface-emitting laser diode, a horizontal-cavity surface emitting laser diode or an edge-emitting laser diode.

9. The semiconductor laser diode according to claim 1, further comprising: a distributed Bragg reflector (DBR) layer, wherein when the semiconductor laser diode is a top-emitting semiconductor diode, the DBR layer is disposed below the first active layer.

10. The semiconductor laser diode according to claim 1, further comprising: a distributed Bragg reflector (DBR) layer, wherein when the semiconductor laser diode is a bottom-emitting semiconductor laser diode, the DBR layer is disposed above the second active layer.

11. The semiconductor laser diode according to claim 1, wherein when the grating layer is a one-dimensional periodic arrangement and the semiconductor laser diode is provided with a ridge structure, a distributed Bragg reflector (DBR) layer is respectively provided on two opposite sides of the semiconductor laser diode.

* * * * *